United States Patent
Yokogawa et al.

(10) Patent No.: US 8,809,727 B2
(45) Date of Patent: Aug. 19, 2014

(54) HEAT TREATMENT APPARATUS

(75) Inventors: Ken'etsu Yokogawa, Tsurugashima (JP); Masatoshi Miyake, Kamakura (JP)

(73) Assignee: Hitachi High-Technologies Corporation, Tokyo (JP)

( * ) Notice: Subject to any disclaimer, the term of this patent is extended or adjusted under 35 U.S.C. 154(b) by 557 days.

(21) Appl. No.: 13/105,981

(22) Filed: May 12, 2011

(65) Prior Publication Data

US 2011/0284506 A1   Nov. 24, 2011

(30) Foreign Application Priority Data

May 18, 2010 (JP) ................. 2010-113813
Mar. 31, 2011 (JP) ................. 2011-079685
Apr. 14, 2011 (JP) ................. 2011-089981

(51) Int. Cl.
*B23K 10/00* (2006.01)

(52) U.S. Cl.
USPC ............ 219/121.54; 219/121.52; 219/121.43; 118/723 R; 118/725; 156/345.37; 156/345.47

(58) Field of Classification Search
CPC ................................. B23K 10/00; H05H 1/46
USPC ............ 219/121.54, 121.43, 121.52, 121.55, 219/121.4; 392/416–418; 118/723 R, 723 I, 118/723 MP, 723 E, 724, 725; 156/345.27, 156/345.47, 345.52, 345.48, 345.43, 345.41
See application file for complete search history.

(56) References Cited

U.S. PATENT DOCUMENTS

| | | | |
|---|---|---|---|
| 5,013,691 A * | 5/1991 | Lory et al. ................... 438/789 |
| 5,558,718 A * | 9/1996 | Leung ...................... 118/723 E |
| 5,615,627 A * | 4/1997 | Marr, Jr. ..................... 110/346 |
| 5,639,309 A * | 6/1997 | Akimoto ................ 118/723 MP |
| 5,680,013 A * | 10/1997 | Dornfest et al. ......... 315/111.21 |
| 5,904,866 A * | 5/1999 | Kasper ..................... 219/121.43 |
| 6,265,690 B1 * | 7/2001 | Fornsel et al. ............. 219/121.5 |
| 6,444,083 B1 * | 9/2002 | Steger et al. ............. 156/345.48 |
| 6,855,906 B2 * | 2/2005 | Brailove .................. 219/121.36 |
| 6,872,908 B2 * | 3/2005 | Ootsuka et al. .......... 219/121.52 |
| 6,885,154 B2 * | 4/2005 | Uchida et al. ............ 315/111.71 |
| 7,183,715 B2 * | 2/2007 | Kanno et al. ............. 315/111.21 |
| 7,274,015 B2 * | 9/2007 | Miller et al. .................. 250/288 |
| 7,560,657 B2 * | 7/2009 | Dougherty et al. ...... 219/121.41 |
| 7,736,933 B2 * | 6/2010 | Arai et al. ........................ 438/57 |
| 8,070,911 B2 * | 12/2011 | Himori et al. ............ 156/345.44 |
| 8,157,951 B2 * | 4/2012 | Buchberger et al. ..... 156/345.27 |

FOREIGN PATENT DOCUMENTS

| | | |
|---|---|---|
| JP | 2009-032774 | 2/2009 |
| JP | 2010-034481 | 2/2010 |

* cited by examiner

*Primary Examiner* — Mark Paschall
(74) *Attorney, Agent, or Firm* — Antonelli, Terry, Stout & Kraus, LLP.

(57) ABSTRACT

The present invention relates to a heat treatment apparatus that performs activation annealing or defect repair annealing and surface oxidization which succeed impurity doping intended to control the conductive property of a semiconductor substrate. In the present invention, a sample to be heated is placed on a lower electrode in a plasma treatment chamber. A gap between an upper electrode and the lower electrode is filled with a gap whose main raw material is a rare gas (helium, argon, krypton, xenon, or the like) having a pressure close to the atmospheric pressure. A power fed from a high-frequency power supply is applied to the upper electrode in order to induce an atmospheric-pressure glow discharge. Gas heating in the gap between the electrodes, which depends on the glow discharge, is used to heat-treat the sample to be heated.

7 Claims, 9 Drawing Sheets

HEAT TREATMENT APPARATUS

CLAIM OF PRIORITY

This application is based upon and claims the benefit of priority from the prior Japanese Patent Application No. 2010-113813, filed on May 18, 2010, Application No. 2011-079685, filed on Mar. 31, 2011, Application No. 2011-089981, filed on Apr. 14, 2011, the entire contents of which are incorporated herein by reference.

BACKGROUND OF THE INVENTION

1. Field of the Invention

The present invention relates to a semiconductor fabrication apparatus that fabricates semiconductor devices, and to a heat treatment technology for performing activation annealing or defect repair annealing and surface oxidization which succeed impurity doping intended to control the conductive property of a semiconductor substrate. More particularly, the invention is concerned with a heat treatment apparatus that requires the high temperature of 1200° C. or more so as to treat a semiconductor which has a substrate thereof made of silicon carbide.

2. Description of the Related Art

In recent years, introduction of a novel material having a wide band gap such as silicon carbide (SiC) (or gallium nitride (GaN)) as a material of a substrate of a power semiconductor device has been expected. Compared with silicon (Si) that is a conventional material, SiC has the wide band gap. Therefore, when SiC is used to fabricate a switching device or Schottky barrier diode that is included in an inverter or the like, a dielectric strength can be improved. In addition, since a leakage current is reduced owing to the improved dielectric strength, power saving can be achieved.

Processes for fabricating various kinds of power devices using SiC as a material of a substrate are broadly identical to those, in which Si is used as the material of the substrate, except the size or the like of the substrate. A process in which a large difference is observed between use of SiC and use of Si is a heat treatment process. The heat treatment process is represented by activation annealing that succeeds impurity ion implantation intended to control the conductive property of the substrate. In the case of a Si device, the activation annealing is performed at the temperature ranging from 800° C. to 1200° C. However, in the case of SiC, the temperature ranging from 1200° C. to 1800° C. is necessary in terms of the material property.

As an annealing apparatus, a resistance heating furnace described in, for example, Japanese Patent Application Laid-Open Publication No. 2009-32774 is known. Aside from the resistance heating furnace, an induction heating type annealing apparatus described in, for example, Japanese Patent Application Laid-Open Publication No. 2010-34481 is known.

SUMMARY OF THE INVENTION

When the resistance heating furnace described in Japanese Patent Application Laid-Open Publication No. 2009-32774 is used to perform heating at 1200° C. or more, problems described below become outstanding.

The first problem is thermal efficiency. Heat dissipated from a furnace body is dominated by radiation, and a magnitude of radiation increases proportionally to the fourth power of temperature. Therefore, if a heating region is wide, energy efficiency required for heating is markedly degraded. In the case of the resistance heating furnace, a double pipe structure is normally adopted in efforts to avoid contamination caused by a heater. The heating region is therefore widened. In addition, since a sample to be heated recedes from a heat source (heater) because of the double pipe, the heater has to be brought to the temperature higher than the temperature of the sample to be heated. This also becomes a factor of degrading the efficiency.

The second problem is wear and tear of a furnace material. As for the furnace material, materials resistive to 1800° C. are limited, and a material exhibiting a high melting point and high purity is needed. The furnace material usable for SiC is graphite or SiC itself. In general, a SiC sintered compact or a member made by coating the surface of a graphite substrate with SIC according to the chemical vapor-phase deposition method is adopted. The sintered compact and member are generally expensive. If the furnace body is large in scale, considerable expenses are required for replacement. The higher the temperature is, the shorter the service life of the furnace body is. The expenses for replacement get higher than those required for an ordinary Si process.

The third problem is occurrence of surface roughing of a sample to be heated due to evaporation. In the case of heating at about 1800° C., Si selectively evaporates from the SiC surface of the sample to be heated so as to cause the surface roughing or cause a doped impurity to come off. Eventually, a necessary device property cannot be obtained. In order to cope with the surface roughing of the sample to be heated from the high temperature, a method of forming a carbon film on the surface of the sample to be heated so as to thus produce a protective film against heating has been adopted in the past. However, according to the convention method, the carbon film has to be formed and removed during other processes for the purpose of heat treatment. Eventually, a man-hour increases and a cost increases.

By the way, the induction heating method described in Japanese Patent Application Laid-Open Publication No. 2010-34481 is a method of feeding a high-frequency inductive current to an object of heating or a placement unit, on which the object of heating is placed, so as to heat the object of heating. Compared with the foregoing resistance heating furnace method, thermal efficiency is high. However, in the case of the inductance heating, if the electrical resistivity of the object of heating is low, a large amount of inductive current is necessary to heating. Therefore, the absolute value of the thermal efficiency of an entire heating system is not always large (because a heat loss caused by an induction coil or the like is large). The problem of thermal efficiency arises.

In addition, heating uniformity is determined with an inductive current that flows into the object of heating or the placement unit on which the object of heating is placed. For a planar disk employed in device fabrication, satisfactory heating uniformity may not be attained. If the heating uniformity is poor, there is a fear that the object of heating may be broken because of a thermal stress during rapid heating. This becomes a factor of degrading a throughput because of the necessity of decreasing the speed of a temperature rise to such an extent that no stress occurs. Further, similarly to the aforesaid resistance heating furnace method, the processes of producing and removing a cap film intended to prevent Si evaporation from the SiC surface at the high temperature are required in addition.

In the present invention, a sample to be heated is placed in a gap between parallel-plate electrodes, the gap between the parallel-plate electrodes is filled with a gas whose main raw material is a rare gas (helium (He), argon (Ar), krypton (Kr), xenon (Xe), or the like)) having a pressure close to the atmospheric pressure, and a high-frequency voltage is applied to the gap between the parallel-plate electrodes. Thus, an atmospheric-pressure glow discharge is induced, and the sample to be heated is heat-treated through the gas heating in the gap which depends on the glow discharge.

The present invention provides a heat treatment apparatus employed in semiconductor device fabrication that requires the high temperature of 1200° C. or more. In particular, the invention provides an apparatus capable of addressing the problems, which have been described previously and underlie the related arts, that is, capable of improving a throughput by improving heating efficiency and shortening a heating processing time, reducing a cost needed to overcome wear and tear of a furnace material or needed for operation, and suppressing surface roughing of a sample to be heated which stems from the high temperature.

DESCRIPTION OF THE PREFERRED EMBODIMENTS

First Embodiment

Figure 1:
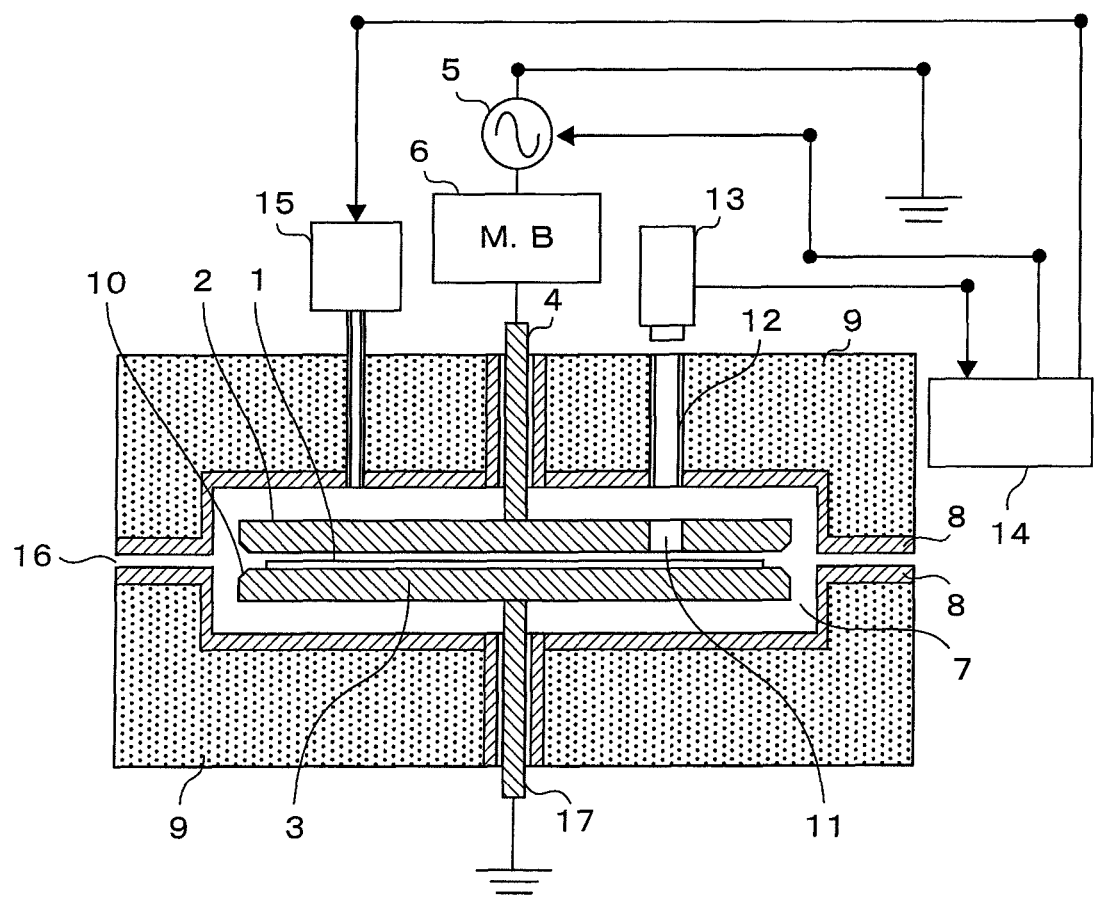
FIG. 1 is a diagram showing a fundamental constitution in accordance with a first embodiment of the present invention.

FIG. 1 shows a fundamental constitution of the present invention. To begin with, the constitution shown in FIG. 1 will be described below. A sample to be heated 1 is placed between parallel-plate electrodes that are an upper electrode 2 and a lower electrode 3. In the present embodiment, a sample made of monocrystalline silicon carbide (hereinafter, SiC) and having 4 inches (100 mm) in diameter is adopted as the sample to be heated 1. The diameter of the upper electrode 2 and lower electrode 3 is 120 mm, and the thickness thereof is 5 mm. The upper electrode 2 and lower electrode 3 are realized with electrodes made by accumulating silicon carbide on the surface of a graphite substrate according to the chemical vapor-phase deposition method. The sample to be heated 1 is placed on the lower electrode 3, and a gap relative to the upper electrode 2 is 0.8 mm wide. Incidentally, the sample to be heated 1 has a thickness ranging from about 0.5 mm to about 0.8 mm, and a dent in which the sample to be heated is locked is formed in the lower electrode 3 on which the sample to be heated 1 is placed, though the dent is not shown.

A high-frequency power is fed from a high-frequency power supply 5 to the upper electrode 2 over a power feed line 4. In the present embodiment, 13.56 MHz is adopted as the frequency of a voltage employed by the high-frequency power supply 5, which is within the radio frequency spectrum of about 3 kHz to 300 GHz. The lower electrode 3 is grounded over a power feed line 17. A matching circuit 6 (M.B in the drawing stands for a matching box) is interposed between the high-frequency power supply 5 and upper electrode 2. The high-frequency power fed from the high-frequency power supply 5 is efficiently fed to plasma produced between the upper electrode 2 and lower electrode 3. The upper electrode 2 and lower electrode 3 are enclosed with a graphite wall 8 and an adiabatic member 9, which serve as a shielding member, via a void layer 7 filled with a gas for isolation. In the present embodiment, an adiabatic member (whose thermal conductivity is 0.3 W/mK) made from a ceramic fiber whose main raw material is aluminum oxide is adopted as the adiabatic member 9. Preferably, the thermal conductivity of the adiabatic member 9 is 0.5 W/mK or less in terms of the thermal efficiency of the apparatus. This is because heat dissipation can be suppressed by decreasing the thermal conductivity. The circumferential corners 10 of the upper electrode 2 and lower electrode 3 respectively which are opposed to each other are tapered or rounded. This is intended to prevent plasma localization due to electric-field concentration at the corners of the electrodes.

Openings 11 and 12 are formed in the upper electrode 2 and the graphite wall 8 and adiabatic member 9, which are located above the upper electrode 2, respectively. The openings are formed in order to observe the temperature of the sample to be heated 1 using a radiation thermometer 13. A mechanism is included for referencing the temperature of the sample to be heated 1 detected by the radiation thermometer 13, controlling an output of the high-frequency power supply 5 using a control unit 14, and thus controlling the temperature of the sample to be heated. A gas of a raw material for use in forming plasma is introduced from a gas introduction unit 15. Both the gap between the upper electrode 2 and lower electrode 3 and the void layer 7 are filled with the gas introduced from the gas introduction unit 15. The gas is exhausted through a gas exhaust part (exhaust vent) 16. The control unit 14 can control a gas type and a gas flow rate.

Next, a description will be made of a principle of heating in the fundamental constitution of the first embodiment shown in FIG. 1. First, argon (Ar) is introduced as a gas from the gas introduction unit. An apparatus is structured so that the gas having a pressure consistent with the atmospheric pressure can be introduced at a flow rate ranging from 10 standard cubic centimeters per minute (sccm) to 1000 sccm. Thereafter, a high-frequency power is fed from the high-frequency power supply 5 to the upper electrode 2, whereby atmospheric-pressure Ar plasma is produced between the upper electrode 2 and the sample to be heated 1 placed on the lower electrode 3. In the present embodiment, the high-frequency power to be fed to the upper electrode 2 is 800 W. High-frequency energy is absorbed by electrons in the plasma, and atoms or molecules in the gas are heated due to collision of the electrons. The atmospheric-pressure plasma enters a thermal equilibrium state in which the temperature of the electrons is nearly equal to the temperature of the atoms or molecules because of the high frequency of collision between the electrons and the gas atoms or molecules. Therefore, the gas can be readily heated up to the temperature ranging from 1000° C. to 2600° C. The sample to be heated 1 is heated due to contact with the heated high-temperature gas and radiation. The sample to be heated 1 can be heated to such an extent that the temperature thereof ranges from 70% or more of the gas temperature to the temperature nearly equal to the gas temperature. The surface of the upper electrode 2 opposed to the sample to be heated 1 is also heated to have the temperature nearly equal to the temperature of the sample to be heated. In the case of a solid having the temperature of 1000° C. or more, a rate at which heat energy is released due to radiation gets higher (a magnitude of radiation increases proportionally to the fourth power of the temperature). Therefore, radiation from the upper electrode 2 also contributes to heating of the sample to be heated. Due to the foregoing principle, the first embodiment can heat the sample to be heated 1 to such an extent that the temperature of the sample to be heated becomes 1200° C. or more necessary to activate SiC.

In the apparatus shown in FIG. 1, the sample to be heated 1, upper electrode 2, and lower electrode 3 have nearly the same temperature. Normally, heat energy is released from these high-temperature parts due to radiation or the like. Accordingly, a large high-frequency power is required for heating, and efficiency is degraded. It is therefore necessary to thermally insulate the high-temperature parts. In the present embodiment, as an adiabatic structure, the upper electrode 2 and lower electrode 3 (including the sample to be heated 1) that are the high-temperature parts are enclosed with the void layer 7. Thereby, heat dissipation from the high-temperature parts due to thermal conduction can be suppressed. Further, the upper electrode 2 and lower electrode 3 are enclosed with the adiabatic member 9. The adiabatic member 9 can suppress heat dissipation from thermal conduction from the high-temperature parts. The adiabatic member 9 is made from a ceramic fiber whose main raw material is, for example, aluminum oxide. Further, the surface of the adiabatic member 9 facing the void layer 7 is covered with the graphite wall 8. The graphite wall 8 fills the role of a shielding member that suppresses heat dissipation due to radiation from the high-temperature parts and also fills the role of a buffering layer against a contamination source. This is because the ceramic fiber may become the contamination source to the high-temperature parts. In addition, there is a possibility that the adiabatic member 9 may be degenerated when used at the high temperature of 1700° C. or more for a long period of time, and may become a contamination source to the sample to be heated 1. In the present first embodiment, first, the void layer 7 formed with an empty space is formed in order to realize the structure in which even when the upper electrode 2 and lower electrode 3 (including the sample to be heated 1) has the temperature of 1800° C., the temperature of the graphite wall 8 and the portion of the adiabatic member 9 in contact with the graphite wall 8 is 1500° C. or less.

In the first embodiment, the sample to be heated 1 can be heated up to the temperature of about 2000° C. according to the foregoing method. If the sample to be heated were heated to exceed 2000° C., a magnitude of thermoelectron emission from the upper electrode 2 or sample to be heated 1 would increase. Therefore, it becomes hard to sustain a stable glow discharge, and the glow discharge is likely to shift to an arc discharge. In the arc discharge, although a high temperature gas state of several thousands of degrees is attained, energy is likely to be localized, and it becomes hard to sustain plasma stably with a planar spread similarly to plasma sustained in the glow discharge state. Therefore, in the present invention, a glow discharge region in which the temperature in a large area can be controlled uniformly and highly precisely is employed. Specifically, the control unit controls the output of the high-frequency power supply so that the temperature of the sample to be heated can fall within a range from 1200° C. or more to 2000° C. or less which is necessary to annealing of SiC.

When the sample to be heated 1 is heated using as a heat source homogeneous plasma and accompanying radiation, uniformity in activation can be improved, and damage to be done to the sample to be heated 1 by a thermal stress can be suppressed at the same time. Therefore, a temperature rise speed can be raised, and a treatment speed can be improved. In addition, for cooling that succeeds completion of heating, gas cooling can be achieved by increasing a flow rate of a gas and feeding the gas after feeding a high-frequency power is ceased. During heating, the gas flow rate is restricted to the lowest possible flow rate in order to suppress release of heat. In contrast, for cooling, the gas is fed at the high flow rate (10 liters per min at most in the first embodiment) in order to achieve quick cooling. Owing to the foregoing heating mechanism, a heating region can be confined to an extremely narrow region compared with a region defined in the resistance heating furnace employed in the related art. Accordingly, energy required for heating can be reduced and responsiveness in temperature control can be upgraded. In general, accelerated ions in plasma may fall on the sample to be heated 1 so as to thus damage the surface of the sample to be heated 1. In contrast, in plasma produced at a high pressure close to the atmospheric pressure, ions frequently collide with gas atoms or molecules. Ion acceleration energy produced with a voltage applied to the plasma and sample to be heated is distributed to the colliding particles. When the energy enters the sample to be heated 1, the energy diminishes to be level with heat energy (0.2 to 0.5 eV). Therefore, the damage on the surface of the sample to be heated 1 from ion bombardment is quite limited.

Advantages of the present invention will be summarized below. In the present art, a sample to be heated is heated using as a heat source gas heating dependent on an atmospheric-pressure glow discharge induced in a narrow gap. Four advantages unavailable in the related arts and described below are provided based on the principle.

The first advantage lies in thermal efficiency. A gas in the gap has a very small heat capacity and exists in the vicinity of opposed electrodes having nearly the same temperature as a sample to be heated. Therefore, the sample to be heated can be heated in a system whose heating capacity is very small and whose heating loss from radiation is very small. Therefore, high energy efficiency can be realized.

The second advantage lies in heating responsiveness and uniformity. Since the heat capacity of a heating part is very small, a fast temperature rise or fall can be achieved. In addition, since gas heating dependent on a glow discharge is used as a heat source, planar and uniform heating can be achieved owing to the spread of the glow discharge. Since temperature uniformity is high, a variance in a device property on the surface of a sample to be heated, which stems from heat treatment, can be suppressed. At the same time, damage caused by a thermal stress from a temperature difference on the surface of the sample to be heated occurring at the time of a rapid temperature rise can be suppressed.

The third advantage is a decrease in the number of parts to be consumed due to heating processing. In the present art, a gas coming into contact with a sample to be heated is directly heated. A region in which temperature rises is limited to members located very close to the sample to be heated, and the temperature is equal to or smaller than the temperature of the sample to be heated. Therefore, the service lives of the members are long, and a region in which parts have to be replaced with new ones because of deterioration is limited.

The fourth advantage is that roughing on the surface of a sample to be heated can be suppressed. In the present art, the sample to be heated is exposed to plasma from an atmospheric-pressure glow discharge and thus heated. On the heating stage, a rare-gas plasma is employed. When a reactive gas is added to a rare gas in the course of a temperature rise or fall, formation and removal of a protective film can be consistently achieved during a heating process. Therefore, the processes of forming and removing the protective film which are performed by an apparatus other than a heat treatment apparatus becomes unnecessary. Eventually, a reduction in a cost of fabrication can be achieved.

Figure 2:
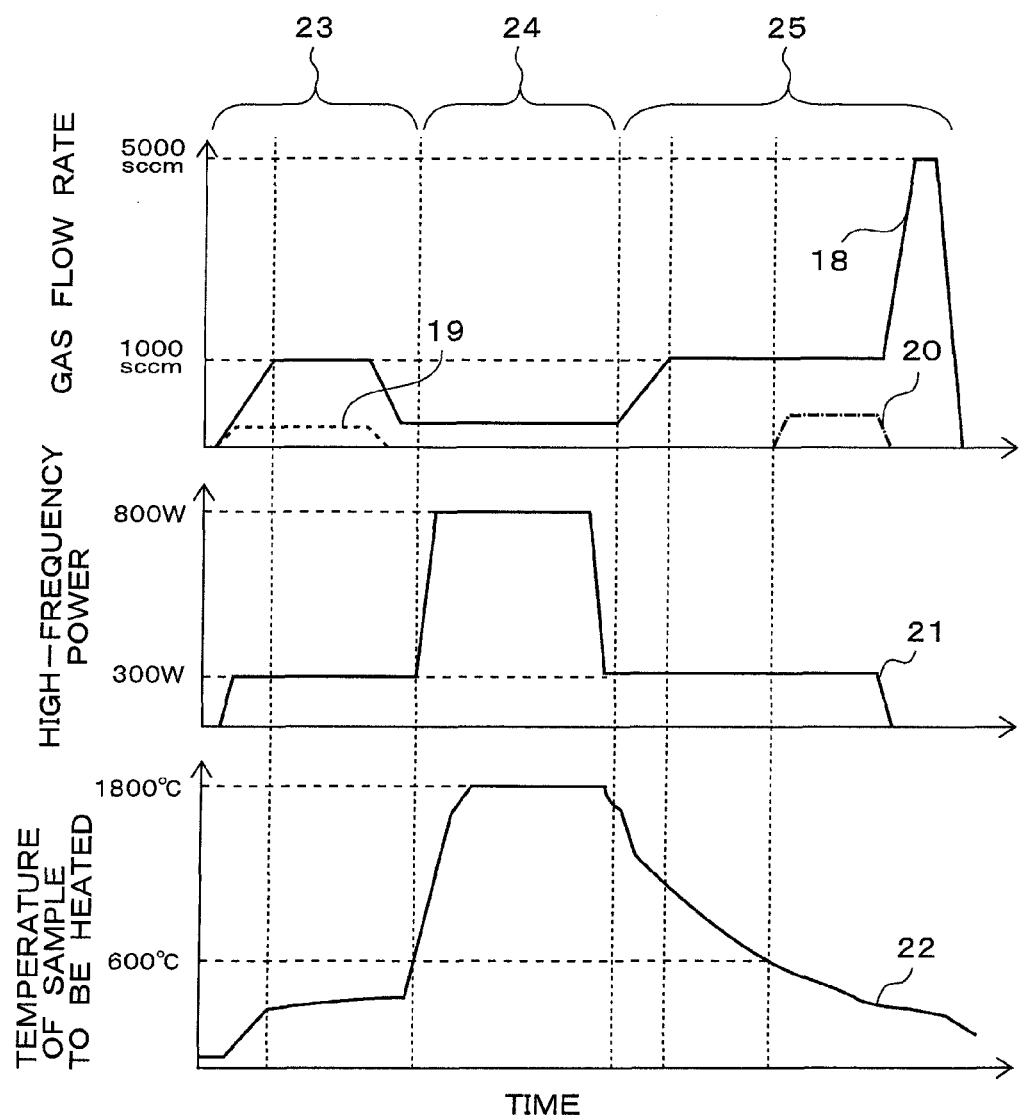
FIG. 2 is an explanatory diagram concerning an operation in the first embodiment.

Next, an operation to be performed in the fundamental constitution shown in FIG. 1 will be described below by taking for instance an activation heat treatment process succeeding impurity implantation in a SiC substrate. FIG. 2 illustratively shows the activation heat treatment process and a transition of the temperature of the sample to be heated 1 which is made in the course of the activation heat treatment. In the drawing, the upper graph indicates a relationship between a gas flow rate, at which a gas is introduced from the gas introduction unit 15, and a time. Reference numeral 18 denotes an illustrative change in an Ar gas flow rate, reference numeral 19 denotes an illustrative change in a methane gas flow rate, and reference numeral 20 denotes an illustrative change in an oxygen gas flow rate. The intermediate graph indicates a relationship between the high-frequency power fed from the high-frequency power supply 5, which is controlled by the control unit 14, and a time. Reference numeral 21 denotes an illustrative change in the high-frequency power. The lower graph indicates a relationship between the temperature of the sample to be heated, which is measured by the radiation thermometer 13, and a time. Reference numeral 22 denotes an illustrative change in the temperature of the sample to be heated. Reference numeral 23 denotes a carbon protective film formation process, reference numeral 24 denotes a heating process, and reference numeral 25 denotes a cooling and carbon protective film removal process.

First, the sample to be heated 1 is placed on the lower electrode 3. Thereafter, methane (or ethylene or any other gap containing carbon) is diluted with Ar, and introduced as a gas. As for concrete flow rates of gases to be introduced, an Ar gas flow rate is 1000 sccm and a methane gas flow rate is 50 sccm. After the gas is introduced, a high-frequency voltage of 13.56 MHz is applied from the high-frequency power supply 5 to the upper electrode 2 in order to form plasma. The high-frequency power applied at this step is 300 W. Since the plasma is formed, carbon atoms dissociated in the plasma are accumulated on the surface of the sample to be heated 1. Thus, a protective film (carbide-series film) for suppressing evaporation from the substrate at the high temperature is formed. Incidentally, a carbide-containing molecule gas may be applied to the protective film in the course of a temperature rise to the heat treatment temperature.

Thereafter, the gas is switched to pure Ar, and the flow rate is decreased to about 20 sccm. When the gas around the sample to be heated 1 is almost fully replaced with the pure Ar, the high-frequency power is increased to 800 W. With the increase in the high-frequency power, the temperature of the sample to be heated 1 rises. The temperature is monitored using the radiation thermometer 13, and controlled to be the desired temperature (1800° C. in the first embodiment). After a necessary heating time (1 min in the present embodiment) elapses at the desired temperature, the high-frequency power is decreased to about 300 W. At this step, the temperature of the sample to be heated 1 begins rapidly falling. The Ar gas flow rate is raised from about 20 sccm to 1000 sccm. When the radiation thermometer 13 demonstrates that the temperature of the sample to be heated 1 is equal to or smaller than about 600° C., oxygen is added to Ar of the gas (1000 sccm) at about 100 sccm. Due to the addition of oxygen, oxygen radicals are produced in the plasma, and the carbon protective film formed on the surface of the sample to be heated 1 and on the upper and lower electrodes is removed accordingly. In the first embodiment, if oxygen is fed in a high-temperature state, there is a possibility that the upper and lower electrodes and the sample to be heated 1 may be oxidized and deteriorated. Therefore, oxygen is not added until the temperature of the sample to be heated 1 falls to about 600° C. When the carbon protective film is removed with the addition of oxygen, the addition of the oxygen and the feed of the high-frequency power are discontinued. Further, the Ar flow rate is raised to about 5000 sccm in order to cool the sample to be heated 1. When the temperature of the sample to be heated 1 becomes equal to or smaller than about 200° C., the sample to be heated 1 is taken out. Thus, a procedure of heating processing is completed through the foregoing process.

In the example shown in FIG. 2, the flow rate of an Ar gas is raised in order to improve cooling efficiency. Alternatively, when the Ar gas is switched to a He gas, which exhibits a higher thermal conductivity, at the time of cooling, the cooling can be achieved more quickly. As described in relation to the process in the first embodiment, since plasma is employed, formation and removal of a carbon protective film intended to prevent deterioration of the sample to be heated 1 due to evaporation can be achieved simultaneously during the heat treatment process. In the apparatus according to the related art, another apparatus is required for the formation and removal of the protective film. The present invention contributes to a large reduction in a cost of fabrication. In addition, since the temperature of the sample to be heated 1 can be controlled at a high speed, a time during which the sample to be heated is left intact in a high temperature state can be shortened to be the shortest time necessary to activation. This also contributes to suppression of deterioration of the sample to be heated 1 due to evaporation or to energy saving.

In the first embodiment, the frequency of 13.56 MHz is used to induce a discharge. The frequency is a frequency for industrial use and is therefore available at a low cost. In addition, a safety criterion against leakage of electromagnetic waves is so low that a configuration of an apparatus can be simplified. However, needless to say, in principle, heating can be achieved at any other frequency under the same principle. In particular, a frequency that is equal to or larger than 1 MHz and falls below 100 MHz is preferable in the present invention. At a frequency smaller than 1 MHz, a high-frequency voltage necessary to feed a power required for heating gets higher, and an abnormal discharge (an unstable discharge or a discharge outside the gap between the upper electrode and lower electrode) occurs. Accordingly, it becomes hard for the apparatus to operate stably. The frequency smaller than 1 MHz is therefore not preferred. Further, a frequency exceeding 100 MHz is not preferred because an impedance in the gap between the upper electrode 2 and lower electrode 3 is so low that it becomes hard to obtain a voltage necessary to produce plasma.

In the first embodiment, the atmospheric pressure (1 atm.) is adopted as a pressure necessary to produce plasma. A range from 0.1 atm. or more to 10 atm. or less can provide the same advantages. At a pressure equal to or smaller than 0.1 atm., the frequency of collision by which electrons in the plasma collide with gas atoms or molecules decreases to establish a non-equilibrium state. Therefore, the temperature of a gas is unlikely to rise. In addition, the frequency of collision by which ions in the plasma collide with the gas atoms or molecules also decreases. Therefore, ions exhibiting relatively high energy (10 eV or more) fall on the surface of the sample to be heated 1. This brings about a concern about damage. In contrast, a pressure equal to or larger than 10 atm. invites an increase in the size of the apparatus because of the necessity of reinforcing a dielectrically strong structure. In addition, a discharge is likely to make a transition to an arc discharge. Therefore, the pressure equal to or larger than 10 atm. is not preferable.

In the first embodiment, the spacing between the upper electrode 2 and the sample to be heated 1 that is placed on the lower electrode 3 is 0.8 mm. Even when the spacing is equal to or larger than 0.1 mm and falls below 2.0 mm, the same advantages can be provided. When the spacing is narrower than 0.1 mm, an impedance in the space between the upper electrode 2 and the sample to be heated 1 decreases and it becomes hard to obtain a high-frequency voltage necessary to a discharge. At the same time, it becomes necessary to eliminate a difference in the spacing in a planar direction between the upper electrode 2 and the sample to be heated 1, and the structure of the electrodes gets complex. Therefore, the spacing narrower than 0.1 mm is not preferred. In contrast, a spacing equal to larger than 2 mm is also not preferred. This is because a voltage causing a discharge to begin at a pressure near the atmospheric pressure gets higher on the basis of the Paschen's law and it becomes hard to produce plasma.

In the first embodiment, a graphite substrate coated with a SiC film is used to form the upper electrode 2 and lower electrode 3 alike. Needless to say, even when graphite alone, a SiC sintered compact, or a monocrystalline SiC alone is adopted, the same advantages can be provided. In the first embodiment, Ar is adopted as a principal component of a gas. Needless to say, even when any other rare gas (He, KR, or Xe) is adopted, the same advantages can be provided.

Second Embodiment

Figure 3:
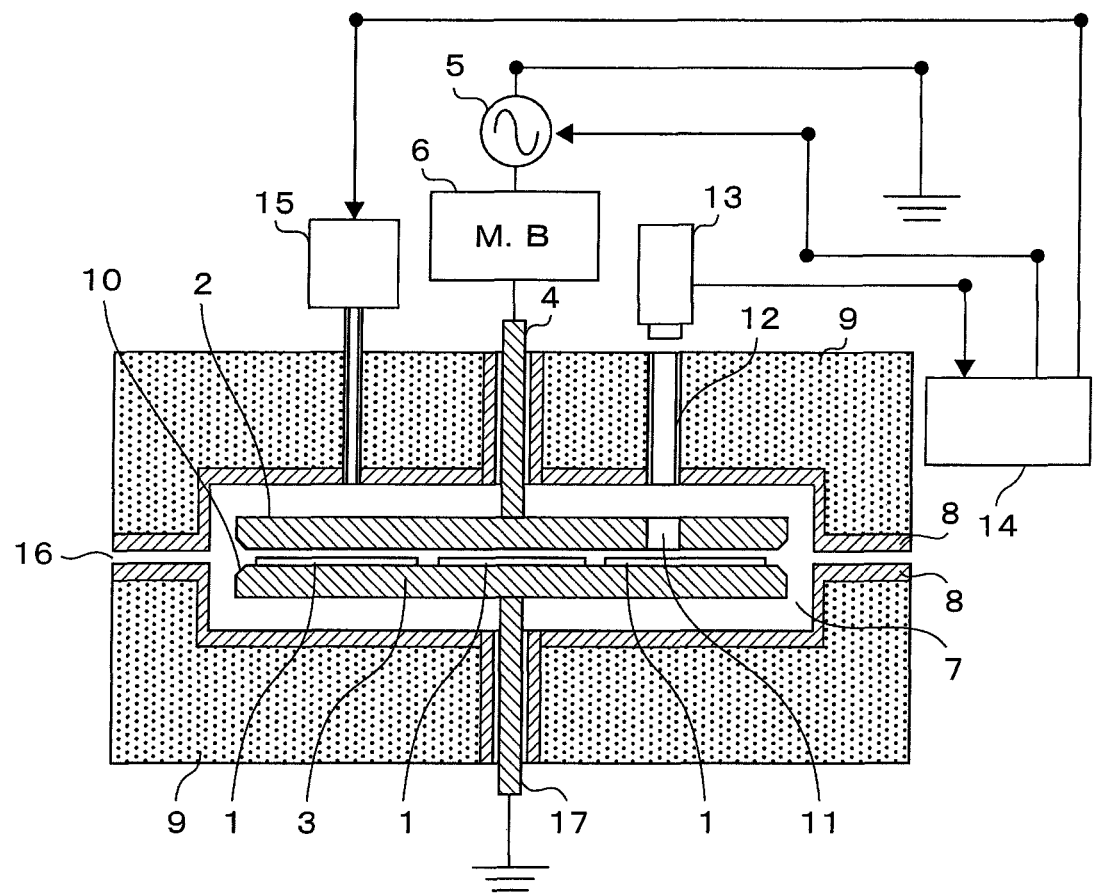
FIG. 3 is a diagram showing a fundamental constitution in accordance with a second embodiment of the present invention.
Figure 4:
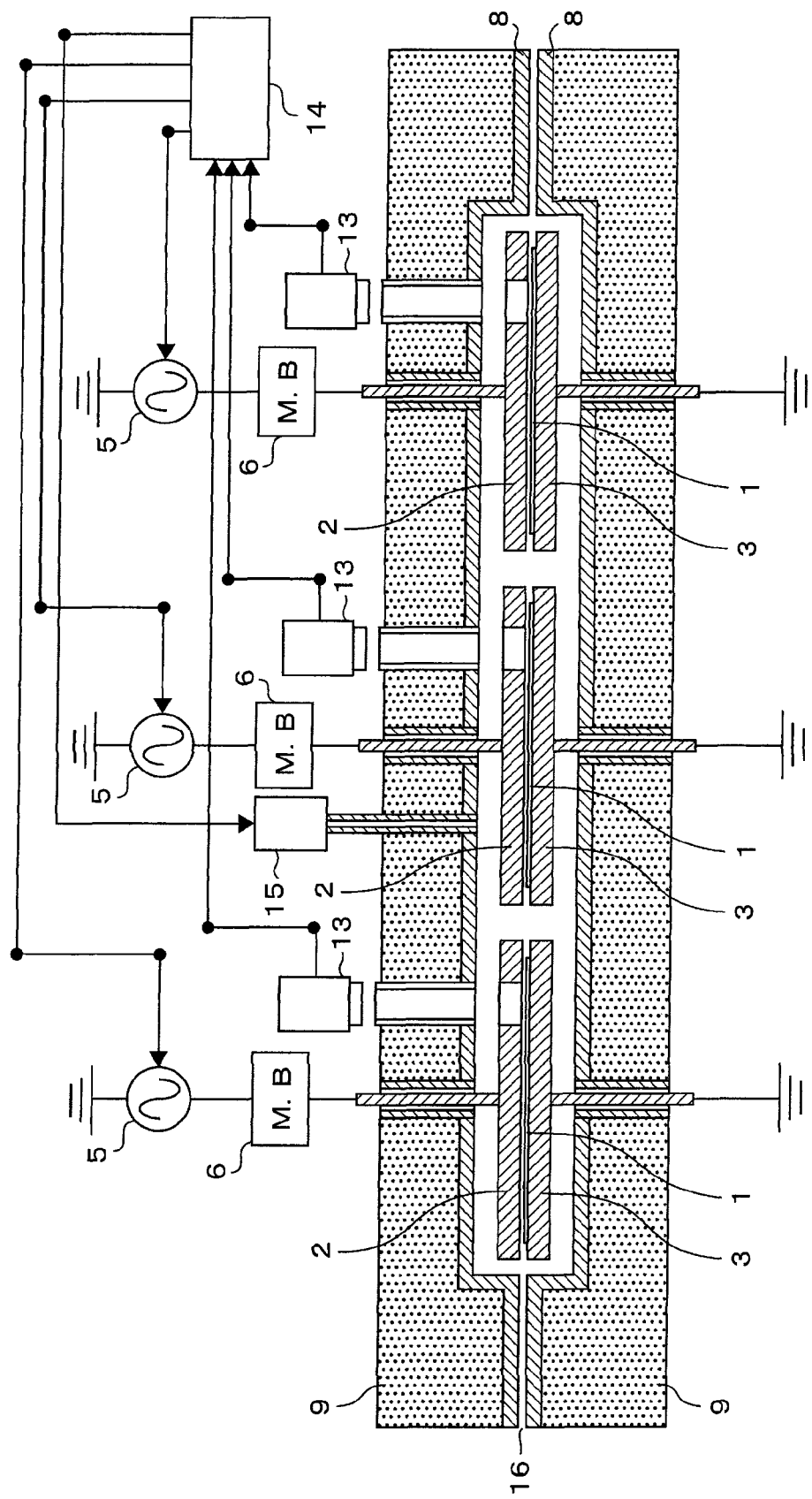
FIG. 4 is a diagram showing a fundamental constitution in accordance with the second embodiment of the present invention.
Figure 5:
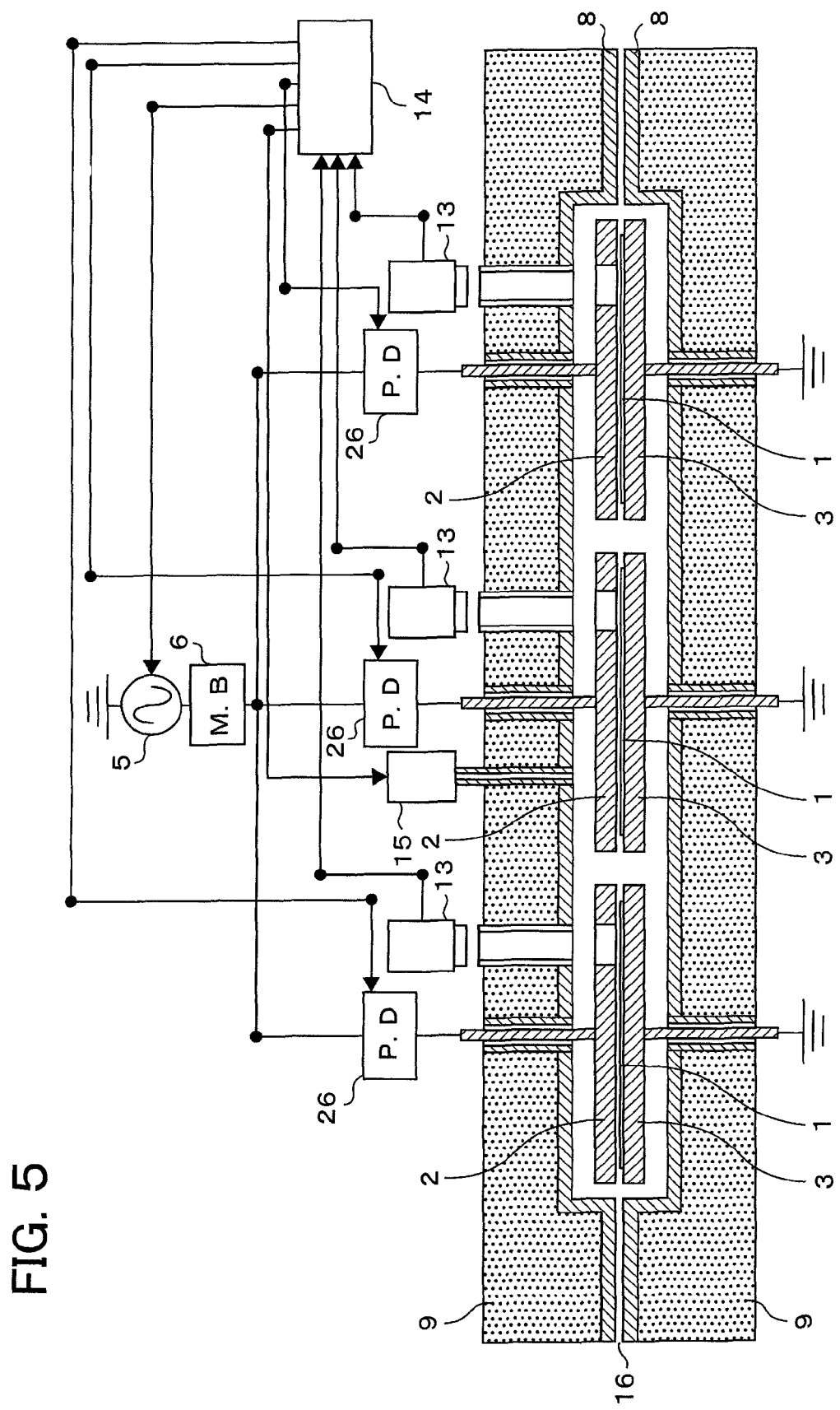
FIG. 5 is a diagram showing a fundamental constitution in accordance with the second embodiment of the present invention.

FIG. 3, FIG. 4, and FIG. 5 show a second embodiment of the present invention. The second embodiment has the same fundamental constitution as the first embodiment shown in FIG. 2, and is intended to increase the number of samples to be treated per unit time (improve the throughput) by treating plural samples to be heated 1 at a time. An apparatus configuration shown in FIG. 3 is intended to improve the throughput by forming an upper electrode 2 and a lower electrode 3 so that the electrodes have a diameter which is twice or more times larger than the diameter of the sample to be heated 1, placing plural samples to be heated 1 on the lower electrode 3, and treating the samples to be heated 1 simultaneously. The temperature of any of the plural samples to be heated is monitored using a radiation thermometer 13. A control unit 14 controls an output of a high-frequency power supply 5 so as to control the temperature of the sample to be heated 1.

In the apparatus configuration shown in FIG. 3, a large-diameter plasma is formed and controlled with an output of the one high-frequency power supply 5 in order to treat the plural samples to be heated 1. Therefore, the temperature of each of the samples to be heated 1 cannot be compensated. FIG. 4 shows an embodiment intended to cope with the problem and precisely control the temperature of each of the samples to be heated 1. In FIG. 4, the high-frequency power supply 5 and radiation thermometer 13 are disposed in association with each of the samples to be heated 1. Based on a measurement value obtained by each of the radiation thermometers 13, an output of each of the high-frequency power supplies 5 is controlled by the control unit 14. Therefore, even when plural samples to be heated are treated simultaneously, a variance in treatment among the samples to be heated can be suppressed by independently controlling treatment conditions for the respective samples to be heated.

FIG. 5 shows an improved one of the apparatus configuration shown in FIG. 4. In the apparatus configuration shown in FIG. 4, although an individual output is small, the same numbers of high-frequency power supplies 5 and matching circuits 6 as the number of samples to be treated have to be included to invite an increase in a cost of fabrication. In FIG. 5, only one pair of the high-frequency power supply 5 and matching circuit is included. An output from the sole high-frequency power supply 5 is divided by power dividers 26 (P.D in the drawing stands form a power divider). An individual power division and the output of the high-frequency power supply 5 are controlled by referencing the measurement values of the respective radiation thermometers 13. Owing to the apparatus configuration shown in FIG. 5, the temperatures of the plural samples to be heated can be individually controlled using the sole high-frequency power supply 5.

Third Embodiment

Figure 6:
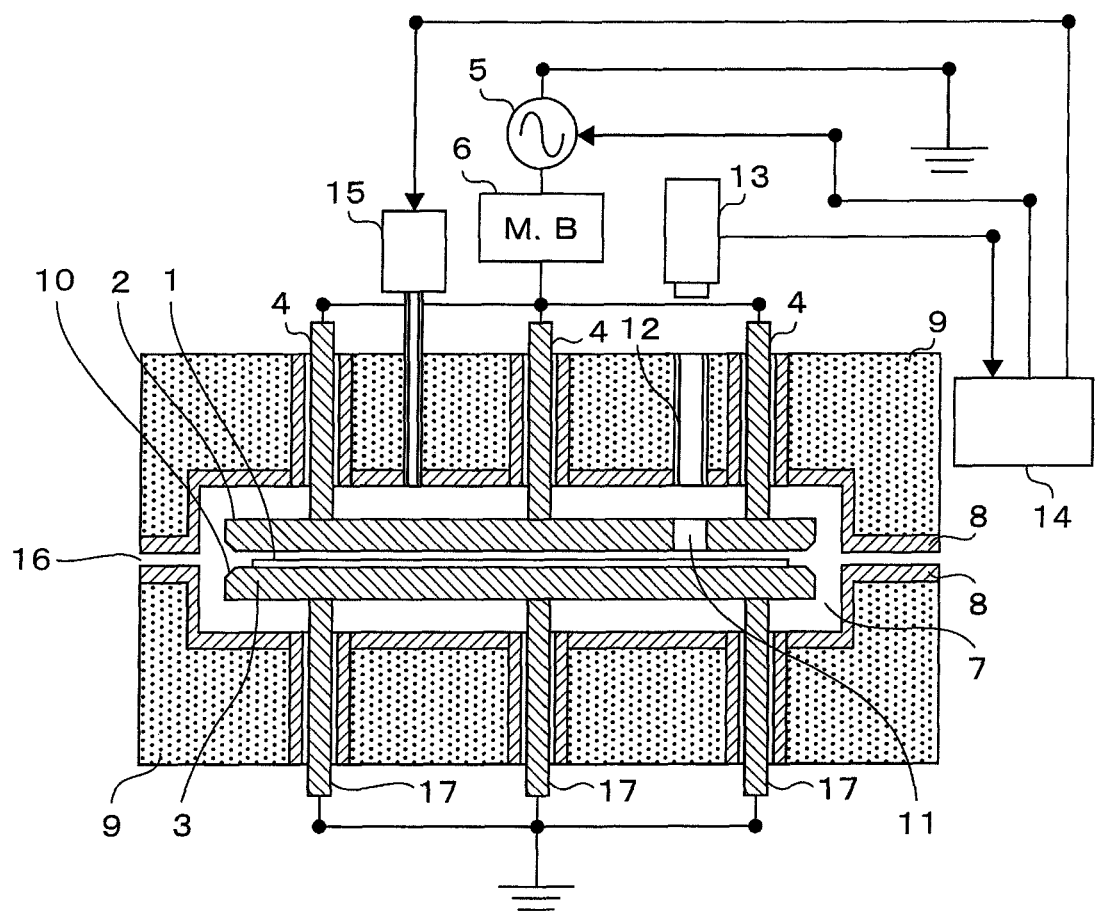
FIG. 6 is a diagram showing a fundamental constitution in accordance with a third embodiment of the present invention.

FIG. 6 shows a third embodiment of the present invention. FIG. 6 shows an embodiment in which an improvement is made in order to improve a temperature distribution attained in the embodiments shown in FIG. 1 and FIG. 3 respectively. In the embodiment shown in FIG. 1 and FIG. 2, part of heat dissipated from the upper electrode 2 and lower electrode 3 is released through propagation over the power feed lines 4 and 17. The power feed lines 4 and 17 are naturally formed to have a minimum necessary cross-sectional area in order to reduce the percentage of the released heat. However, the power feed lines need a certain circumference so as to pass a high-frequency power (since the high-frequency power propagates on the surface of the line, the circumferential length rather than the cross-sectional area counts). Therefore, heat dissipation from the power feed lines 4 and 17 cannot be fully prevented. When the power feed lines 4 and 17 are, similarly to those in the apparatus configurations shown in FIG. 1 and FIG. 3, coupled to one parts of the respective electrodes, the temperature around each of the parts falls to become a factor of non-uniformity in temperature. In FIG. 6, the sets of power feed lines 4 and 17 are coupled to the respective electrodes in order to resolve the non-uniformity in temperature from heat dissipation over the power feed line. In the apparatus configuration shown in FIG. 6, when N power feed lines are coupled to each electrode, the circumferential length (proportional to the diameter) of each of the power feed lines can be a 1/N of the circumferential length required when one power feed line is coupled to each electrode. Since a high-frequency current flows over only the surface of a power feed line due to the skin effect, when N power feed lines having the 1/N of the diameter required when one power feed line is coupled to each electrode are coupled to each electrode, the ability to pass a high-frequency power becomes equal to that of the one power feed line. In contrast, an amount of heat dissipated over a power feed line is proportional to the cross-sectional area of the power feed line. Therefore, in the apparatus configuration shown in FIG. 6, an amount of heat dissipated from the N power feed lines having the 1/N of the diameter required when one power feed line is coupled to each electrode are coupled to each electrode is a 1/N of the amount of heat dissipated from the one power feed line (because the cross-sectional area of each of the N power feed lines is proportional to $(1/N)^2$ and the total cross-sectional area proportional to an amount of propagating heat is N times larger). Eventually, an absolute amount of dissipated heat can be restricted.

Fourth Embodiment

A fourth embodiment of the present invention will be described below in conjunction with FIG. 7 to FIG. 9. Incidentally, points described in relation to any of the first to third embodiments but not described in relation to the present embodiment can apply to the present embodiment unless otherwise noted.

To begin with, the fundamental constitution in accordance with the present embodiment will be described in conjunction with FIG. 7. A sample to be heated 1 is placed on one of parallel-plate electrodes that are an upper electrode 2 and a lower electrode 3. In the present embodiment, a disk made of monocrystalline silicon carbide (hereinafter SiC) and having a diameter of 4 inches (100 mm) is adopted as the sample to be heated 1. The diameter of the upper electrode 2 and lower electrode 3 is 120 mm, and the thickness thereof is 5 mm. As the upper electrode 2 and lower electrode 3, electrodes made by accumulating silicon carbide on the surface of a graphite substrate according to the chemical vapor-phase deposition method are adopted. The sample to be heated 1 is placed on the lower electrode 3, and the gap 104 relative to the upper electrode 2 is 0.8 mm wide. Incidentally, the sample to be heated 1 has a thickness ranging from about 0.5 mm to about 0.8 mm, and a dent in which the sample to be heated 1 is locked is formed in the lower electrode 3 on which the sample to be heated 1 is placed. The circumferential corners of the upper electrode 2 and lower electrode 3 which are opposed to each other are tapered or rounded. This is intended to suppress localization of plasma from concentration of an electric field on the corners of the electrodes.

To the upper electrode 2, a high-frequency power is fed from a high-frequency power supply 5 over a power feed line 4. In the present embodiment, 13.56 MHz is adopted as the frequency of a voltage employed by the high-frequency power supply 5. The lower electrode 3 is grounded over a power feed line 17. The power feed lines 4 and 17 are made of graphite that is a material made into the upper electrode 2 and lower electrode 3. A matching circuit 6 (M. B in the drawing stands for matching box) is interposed between the high-frequency power supply 5 and upper electrode 2. Thus, the high-frequency power fed from the high-frequency power supply 5 is efficiently fed to plasma formed between the upper electrode 2 and lower electrode 3.

To a container 109 in which the upper electrode 2 and lower electrode 3 are disposed, a gas can be introduced at a pressure ranging from 0.1 atm. to 10 atm. by means of a first gas introduction unit 110. The gas is introduced into the gap 104 between the parallel-plate electrodes over a gas passage 111 in the power feed line 4. The pressure of the introduced gas is monitored by a pressure detection unit 112. The gas can be exhausted from the container 109 through an exhaust vent 16 by means of a vacuum pump coupled to a pressure adjustment valve 114. A plate or coating 115 exhibiting a high melting point and a low radiation factor is placed on each of the sides of the upper electrode 2 and lower electrode 3 that do not come into contact with plasma. Around the parallel-plate electrodes, shields 116 made of graphite or a SiC material are disposed. Heaters 117 are attached to the shields 116.

A cooling mechanism 118 is disposed on the container 109. The temperature of the sample to be heated 1 is measured using a radiation thermometer 13. In the present embodiment, as the plate or coating 115 that exhibits a high melting point and a low radiation factor and that is disposed on each of the sides of the upper electrode 2 and lower electrode 3 which do not come into contact with plasma, a plate having tantalum carbide (TaC) coated over a graphite substrate is adopted. Reference numeral 14 denotes a control unit, reference numeral 120 denotes a raising and lowering mechanism for the lower electrode, and reference numeral 121 denotes a power introduction terminal. Reference numeral 122 denotes a raising and lowering mechanism for a sample to be heated, and reference numeral 123 denotes a driving power supply and control mechanism for the raising and lowering mechanism 120. Reference numeral 124 denotes a driving power supply and control mechanism for the pressure adjustment valve, and reference numeral 125 denotes a power supply and control mechanism for the heaters. Reference numeral 127 denotes a second gas introduction unit, and reference numeral 219 denotes a transport orifice for the sample to be heated. The same reference numerals denote the same components. The control unit 14 references the temperature measured by a temperature measurement instrument, and controls an output of the high-frequency power supply so as to control the heat treatment temperature for the sample to be heated. In addition, the control unit controls the foregoing gas introduction units, sample raising and lowering mechanism, and others.

Next, an example of a basic operation of the heat treatment apparatus shown in FIG. 7 will be described below. First, the container 109 is degassed through the exhaust vent 16 and brought to a high vacuum state. At this time, the surroundings of the electrodes are preliminarily headed by the heaters 117 attached to the shields 116 (in the present embodiment, the temperature of the shields 116 is raised to 400° C.) in order to exhaust an adsorptive gas or the like.

After the container is fully deaerated, the exhaust vent 16 is closed. A gas is then introduced from the first gas introduction unit 110 until the pressure in the container 109 becomes about 0.6 atm. In the present embodiment, He is adopted as the introduced gas. When the He gas is introduced, heat of the shields 116 propagates to the upper electrode 2 and lower electrode 3 as well as the plate or coating 115, which exhibits a high melting point and a low radiation factor, due to the thermal conduction by the gas. Accordingly, the upper electrode 2, lower electrode 3, and plate or coating 115 are preliminarily heated. At this time, since the adsorptive gas is generated again, after the container is fully deaerated, the He gas with which the container 109 is filled is exhausted through the exhaust vent 16.

After the gas is exhausted, He is introduced again by the first gas introduction unit 110 in order to set the container to a pressure necessary to heat treatment (ranging from 0.1 atm. to 10 atm.) (0.6 atm. in the present embodiment). The exhaust vent 16 is then closed. When the temperature of the upper electrode 2 and lower electrode 3 has been stabilized through the preliminary heating performed by the heaters 117, the sample to be heated 1 is brought through the transport orifice 219, and placed on the lower electrode 3. The placement of the sample to be heated 1 on the lower electrode 3 will be detailed later by referring to FIG. 8A, FIG. 8B, and FIG. 9.

After the sample to be heated 1 is placed on the lower electrode 3, the lower electrode 3 is disposed at a predetermined position (in the present embodiment, the gap 104 is 0.8 μM wide) by means of the raising and lowering mechanism 120. After the lower electrode 3 is disposed at the predetermined position, a high-frequency power from the high-frequency power supply 5 is fed to the upper electrode 2 via the matching circuit 6 and power introduction terminal 121. Thus, plasma is produced in the gap 104 in order to heat the sample to be heated 1.

The energy of the high-frequency power is absorbed by electrons in the plasma, and atoms or molecules of the gas are heated through collision with the electrons. In the plasma at a pressure close to the atmospheric pressure, the frequency of collision by which the electrons collide with the gas atoms or molecules is so high that a thermal equilibrium state in which the temperature of the electrons is nearly equal to the temperature of the atoms or molecules is established. The temperature of the gas can be readily raised to the temperature ranging from about 1200° C. to about 2000° C. The sample to be heated 1 is heated due to contact with the heated high-temperature gas and radiation thereof. The sample to be heated 1 can be heated from the temperature, which corresponds to 70% or more of the gas temperature, up to the temperature nearly equal to the gap temperature. The surface of the upper electrode 2 opposed to the sample to be heated 1 is also heated and takes on nearly the same temperature as the sample to be heated.

At the time of heating, a small amount of He gas is fed from the first gas introduction unit 110, and the pressure adjustment valve 114 is controlled in order to hold the pressure of the container 109 constant. A flow rate of a He gas to be introduced for heating processing is, in the present embodiment, about 100 sccm. The reason why the He gas flow rate is set to about 100 sccm is to sustain the gas purity in the gap 104 during heating processing. As long as the gas purity is fully sustained during heating, the gas flow rate may be able to be decreased. Naturally, if there is no problem in the gas purity, the He gas may not be introduced. The higher the gas flow rate at which the gas is fed during heating is, the larger a heat loss is. Preferably, the gas flow rate is set to a minimum necessary.

The temperature of the sample to be heated 1 attained during heating is measured using the radiation thermometer 13. An output of the high-frequency power supply 5 is controlled while being interlocked to the measurement, so that the sample to be heated 1 can be brought to the predetermined temperature. Therefore, the temperature of the sample to be heated 1 can be highly precisely controlled. In the present embodiment, a high-frequency power to be fed is 10 kW at maximum. The upper electrode 2 and lower electrode 3 are heated to have nearly the same temperature as the sample to be heated 1 does.

In order to efficiently raise the temperature of the upper electrode 2 and lower electrode 3 (including the sample to be heated 1), it is necessary to suppress heat transfer over the power feed lines 4 and 17, heat transfer through an He gas atmosphere, and radiation from a high-temperature region (ranging from infrared light to visible light). In particular, in a high temperature state at 1200° C. or more, heat dissipation due to radiation is quite significant. Minimization of a radiation loss is essential to improve heating efficiency (the radiation loss increases in proportion to the fourth power of absolute temperature). In the present embodiment, in order to suppress the radiation loss, the plate or coating 115 exhibiting a high melting point and a low radiation factor is placed on the upper electrode 2 and lower electrode 3 alike. TaC is adopted as a material exhibiting the high melting point and low radiation factor. The radiation factor of TaC ranges from about 0.05 to about 0.1. Infrared light from the radiation is reflected from TaC at a reflectance of about 90% (1200° C. to 1800° C.). Therefore, the radiation loss from the upper electrode 2 and lower electrode 3 can be restricted, and the sample to be heated 1 can be heated up to the high temperature, which ranges from about 1200° C. to about 2000° C., with high thermal efficiency.

TaC is disposed so as not to come into direct contact with plasma. Therefore, Ta or an impurity contained in TaC is not be mixed into the sample to be heated 1 during heat treatment. In addition, the heat capacity of the plate or coating 115 exhibiting a high melting point and a low radiation factor and being made of TaC is so small that an increase in the heat capacity of a heating part can be minimized. Therefore, a decrease in a temperature rise/fall speed due to inclusion of the plate or coating 115 exhibiting the high melting point and low radiation factor is hardly observed. Since plasma in a glow discharge region is employed, uniformly spread plasma can be formed between the upper electrode 2 and lower electrode 3. The planar plasma is used as a heat source to heat the sample to be heated 1, whereby the planar sample to be heated 1 can be uniformly heated.

In addition, since the sample to be heated can be uniformly heated on a planar basis, even when the temperature is raised fast, a risk that a breakage in the sample to be heated 1 may stem from non-uniformity in temperature remains low. Therefore, since a fast temperature rise or fall can be achieved, a time required for a procedure of heating processing can be shortened. Owing to the advantage, the throughput for heating processing can be improved, a stay of the sample to be heated 1 in a high-temperature atmosphere for an unnecessarily long period of time can be prevented, and SiC surface roughing or the like due to the high temperature can be minimized.

After the heating is completed, when a certain cooling time has elapsed and the temperature of the sample to be heated 1 has fallen to some extent, the sample to be heated 1 is carried through the transport orifice 219, and the next sample to be heated is brought and placed on the lower electrode 3. The operating procedure is repeated to achieve treatment. When the sample to be heated 1 is replaced with the next one, if the gas atmosphere at the withdrawal position of the sample to be heated which leads to the transport orifice 219 is held on a level with that in the container 109, it becomes unnecessary to renew He in the container 109 at the time of replacing the sample to be heated with the next one. Accordingly, an amount of gas to be used can be reduced. Naturally, after treatment is repeated some times, the He purity in the container 109 may decrease. In this case, He is regularly renewed.

When He is adopted as a discharge gas, since He is a relatively expensive gas, if the amount of He to be used is reduced as much as possible, it would lead to a reduction in a running cost. The same applies to an amount of He gas to be introduced during heating processing. If a minimum flow rate necessary to sustain the gas purity during treatment is adopted, an amount of gas to be used can be reduced. In particular, in the embodiment shown in FIG. 7, since a gas is directly introduced into the gap 104, the gas purity in the gap which directly affects plasma production or heating processing can be attained at the minimum necessary amount of gas to be introduced. In addition, the cooling time for the sample to be heated 1 can be shorted by introducing He as mentioned above. Specifically, after heating processing is completed (discharge is completed), if the He gas flow rate is increased, the cooling time can be shorted due to the gas cooling effect.

Figure 7:
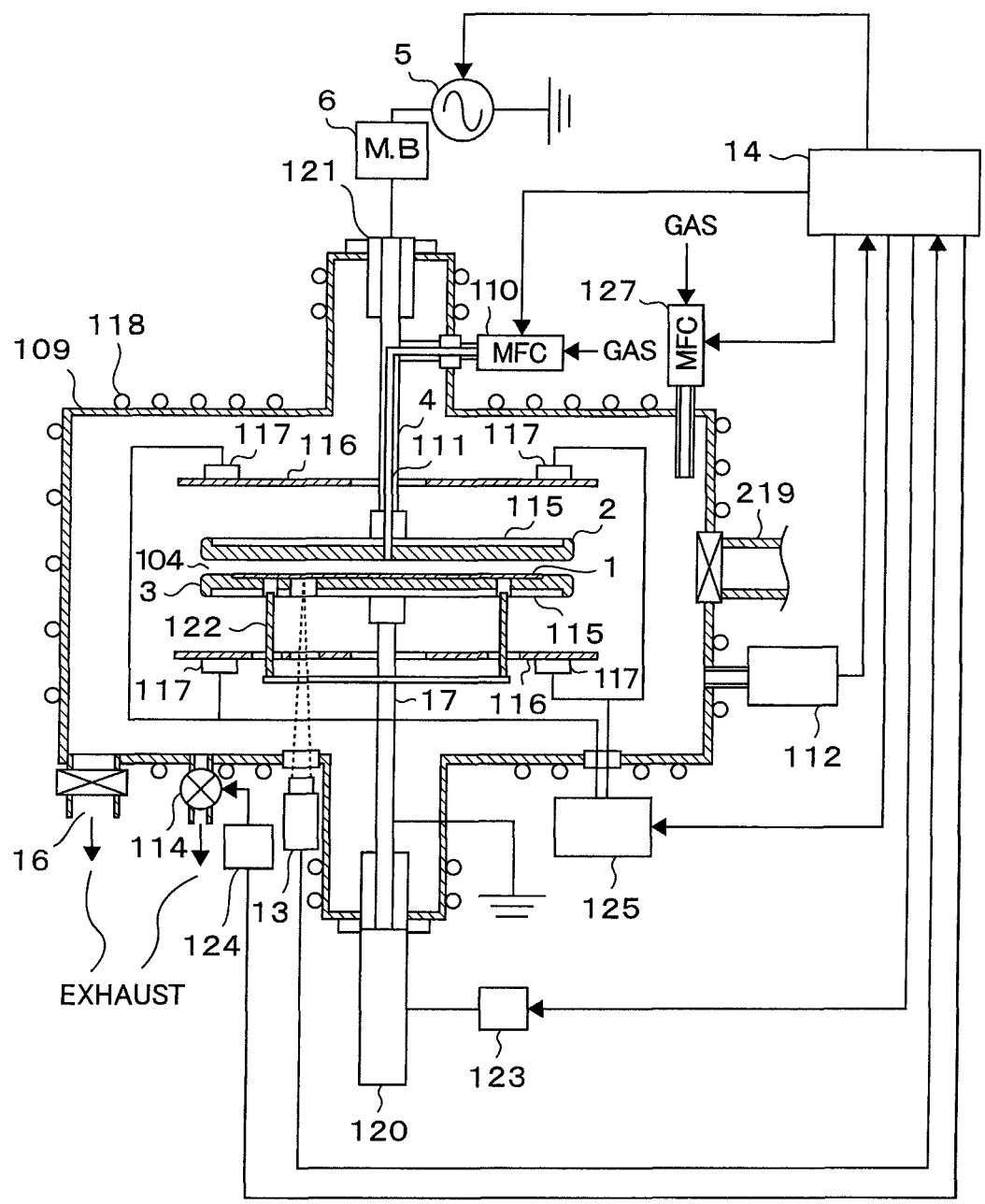
FIG. 7 is a diagram showing a fundamental constitution in accordance with a fourth embodiment of the present invention.

Using the heat treatment apparatus shown in FIG. 7, a SiC substrate that has undergone ion implantation is heat-treated at 1500° C. for 1 min. As a result, an excellent conductive property can be provided. Incidentally, since a temperature rise or fall can be achieved for a short period of time, even when a protective film is not formed on the surface of the substrate, the surface of the SiC substrate is free from surface roughing.

In the basic operation of the heat treatment apparatus shown in FIG. 7, the gap 104 is 0.8 mm wide. Even when the gap 104 has a width ranging from 1 mm to 2 mm, the same advantages can be provided. Even when the gap is narrower than 0.1 mm, a discharge can be induced. However, a highly precise feature is needed in order to sustain the parallelism between the upper electrode 2 and lower electrode 3. In addition, degeneration (roughing or the like) of the surfaces of the electrodes adversely affects plasma. Therefore, the gap narrower than 0.1 mm is not preferred. In contrast, when the gap 104 has a width exceeding 2 mm, degradation in the ignitability of plasma or an increase in a radiation loss through the gap poses a problem. Therefore, the gap having the width that exceeds 2 mm is not preferred.

In the basic operation of the heat treatment apparatus shown in FIG. 7, a pressure for plasma formation is set to 0.6 atm. Even when the pressure ranges from 0.1 atm. to 10 atm., the same operation can be achieved. If the apparatus is operated at a pressure lower than 0.1 atm., a heat loss due to heat transfer from the upper electrode 2 and lower electrode 3 through the gas atmosphere can be reduced. In addition, a transition from a glow discharge to an arc discharge from a temperature rise can be suppressed. However, at the pressure lower than 0.1 atm., ions in plasma are likely to fall on the sample to be heated 1 with relatively high energy. This is not desirable because of the ability to damage the sample to be heated. In general, kinetic energy damaging a crystalline surface is equal to or larger than 10 electron volts (eV). If the ions are accelerated to exert energy exceeding 10 eV, damage is done. Therefore, the energy of the ions that fall on the sample to be heated 1 has to be equal to or smaller than 10 eV.

Ions in plasma are accelerated by a voltage in an ion sheath formed on the surface of the sample to be heated 1, and then routed to the sample to be heated. The voltage in the ion sheath is developed with the difference in energy between ions in a plasma bulk and electrons therein. Therefore, at the atmospheric pressure at which ions, electrons, and neutral particles lie in a thermal equilibrium state, development of the voltage in the ion sheath is limited. In addition, collision with neutral atoms in the ion sheath occurs about 100 to 1000 times. Therefore, a surface damage of the sample to be heated 1 caused by ions falling on the sample to be heated is hardly observed.

However, as depressurization proceeds, there arises a difference in kinetic energy between ions and electrons. A voltage that accelerates the ions is developed in the ion sheath. Assume that a potential difference ranging from, for example, several tens of volts to about 100 V arises in the ion sheath. The thickness of the ion sheath normally ranges from several tens of micrometers to several hundreds of micrometers. The mean free path of He ions is equal to or smaller than 20 μm in a He atmosphere at, for example, 1800° C. and 0.1 atm. or less. Therefore, the frequency of collision in the ion sheath ranges from about 1 to about 10, and a possibility that the ions are accelerated to almost provide the potential difference gets higher. Eventually, a possibility that ions whose energy exceeds 10 electron volts may fall on the sample to be heated gets higher.

In the basic operation of the heat treatment apparatus shown in FIG. 7, He is adopted as a gas for plasma production. Needless to say, even when a rare gas such as Ar, Xe, or Kr is adopted, the same advantages can be provided. He employed in a description of the operation is superb in plasma ignitability at a pressure close to the atmospheric pressure and in stability. However, the gas exhibits a high thermal conductivity, and a heat loss due to heat transfer through the gas atmosphere is relatively large. In contrast, a gas having a large mass such as Ar exhibits a low thermal conductivity and is therefore advantageous in terms of thermal efficiency. When a hydrocarbon-series gas is added to a rare gas in order to produce plasma, a carbon protective film that prevents surface roughing from heating of the surface of the sample to be heated 1 can be formed on a stage preceding heating. Likewise, when an oxygen gas is added after completion of heating (on a stage on which the temperature of the sample to be heated 1 has fallen to some extent) in order to produce plasma, the carbon-series film can be removed. Before heat treatment of the sample to be heated is carried out or while a temperature rise is in progress, if a carbon containing molecular gas is added to plasma in order to form a protective film, which is a carbon-series film, on the surface of the sample to be heated, control is implemented by the control unit 14. In addition, after heat treatment is carried out, if oxygen is added to plasma in order to remove the protective film, control is implemented by the control unit 14.

In the present embodiment, as the plate or coating 115 exhibiting a high melting point and a low radiation factor and being placed on each of the sides of the upper electrode 2 and lower electrode 3 which do not come into contact with plasma, a plate having tantalum carbide (TaC) coated over a graphite substrate is adopted. Even when tungsten carbide (WC), molybdenum carbide (MoC), tantalum (Ta), molybdenum (Mo), or tungsten (W) is adopted, the same advantages can be provided.

In the basic operation of the heat treatment apparatus shown in FIG. 7, a gas is introduced into the gap between the upper electrode 2 and lower electrode 3 using the first gas introduction unit 110 alone. Alternatively, aside from the first gas introduction unit 110, a second gas introduction unit 127 may be included in order to introduce a gas into any place other than the gap between the upper electrode 2 and lower electrode 3. After the container 109 is deaerated to be a vacuum, if the container is filled with a gas, the second gas introduction unit 127 is used to introduce the gas at a relatively high flow rate. For feeding a relatively small amount of gas to the sample to be heated 1 during heat treatment or during a cooling period succeeding the heat treatment, the first gas introduction unit 110 is employed. When the container 109 is exposed to the atmosphere or is filled with the gas after being deaerated, the second gas introduction unit 127 is employed.

In the aforesaid embodiments, the upper electrode 2 and lower electrode 3 are formed by coating a graphite substrate with silicon carbide according to the chemical vapor deposition (CVD) method. Alternatively, graphite alone, a member having graphite coated with pyrolytic carbon, a member having the surface of graphite vitrified, or SiC (a sintered compact, polycrystal, or monocrystal) may be adopted. Nevertheless, the same advantages can be provided. Needless to say, graphite made into the substrate of each of the upper electrode 2 and lower electrode 3, and coating applied to the surface of the substrate are preferably those exhibiting high purities from the viewpoint of preventing contamination of the sample to be heated 1.

In the aforesaid embodiments, TaC is used to form the plate or coating 115 exhibiting a high melting point and a low radiation factor. Even when any other material exhibiting the high melting point (enabling the material to withstand use temperature) and low radiation factor is adopted, the same advantages can be provided. For example, even when tantalum (Ta) alone, molybdenum (Mo), tungsten (W), or tungsten carbide (WC) is adopted, the same advantages can be provided. At the high temperature, the sample to be heated 1 may be contaminated by the power feed lines 4 and 17. Therefore, in the present embodiment, the power feed lines 4 and 17 are, similarly to the upper electrode 2 and lower electrode 3, made of graphite. Heat from the upper electrode 2 and lower electrode 3 is transferred over the power feed lines 4 and 17, and regarded as a loss. Therefore, it is necessary to minimize heat transfer over the power feed lines 4 and 17. Therefore, the cross-sectional area of the power feed lines 4 and 17 made of graphite is made as small as possible, and the length thereof is made as long as possible. However, when the cross-sectional area of the power feed lines 4 and 17 is too small and the length thereof is too long, a high-frequency power loss occurring on the power feed lines 4 and 17 gets larger. This invites degradation in heating efficiency for the sample to be heated 1. In the present embodiment, from the foregoing viewpoint, the cross-sectional area of the power feed lines 4 and 17 made of graphite is set to 12 mm$^2$, and the length thereof is set to 40 mm. As long as the cross-sectional area ranges from 5 mm$^2$ to 30 mm$^2$ and the length ranges from 30 mm to 100 mm, the same advantages can be provided.

In the present embodiment, heat dissipation from the upper electrode 2 and lower electrode 3 which determines heating efficiency is, as mentioned above, dominated by (1) radiation, (2) heat transfer through a gas atmosphere, and (3) heat transfer over the power feed lines 4 and 17. At 1200° C. or more, the heat dissipation is dominated mainly by (1) radiation. For suppression of the radiation, the plate or coating 115 exhibiting a high melting point and a low radiation factor is disposed on each of the sides of the upper electrode 2 and lower electrode 3 which do not come into contact with plasma. Heat dissipation over the power feed lines 4 and 17 is minimized by optimizing the cross-sectional area and length of the power peed lines.

As for the remaining (2) heat transfer through a gas atmosphere, the heat transfer is suppressed by adjusting a heat transfer distance of a gas (a distance between the upper electrode 2 or lower electrode 3, which is a high-temperature part, and the shield 116 or the wall of the container 109 which is a low-temperature part). In a He atmosphere in which a pressure is close to the atmospheric pressure, heat dissipation from heat transfer by a gas is relatively intensified (because the thermal conductivity of He is high). Therefore, in the present embodiment, 30 mm or more is ensured as the distance from the upper electrode 2 or lower electrode 3 to the shield 116 or the wall of the container 109. The longer distance is advantageous for suppression of heat dissipation. However, since the size of the container 109 gets too large relative to a heating region, the longer distance is not preferred. When the distance of 30 mm or more is ensured, while the size of the container 109 is restricted, the heat dissipation from heat transfer through the gas atmosphere can be suppressed. Naturally, if Ar exhibiting a low thermal conductivity is adopted or a pressure is decreased (down to 0.01 atm. or more), the heat transfer through the gas atmosphere can be further suppressed.

In the present embodiment, 13.56 MHz is used to induce a discharge. The reasons why 13.56 MHz is used are that since 13.56 MHz is a frequency for industrial use, a power supply is available at a low cost, and that a safety criterion against leakage of electromagnetic waves is so low that a cost of an apparatus can be decreased. However, in principle, needless to say, heating can be achieved at any other frequency under the same principle. In particular, a frequency that is equal to or larger than 1 MHz and falls below 100 MHz is preferred in the present embodiment. At a frequency lower than 1 MHz, a high-frequency voltage to be applied in order to feed a power necessary to heating gets higher. This brings about an abnormal discharge (an unstable discharge or a discharge outside the gap between the upper electrode and lower electrode), and it becomes hard for the apparatus to operate stably. Therefore, the frequency lower than 1 MHz is not preferred. Further, at a frequency exceeding 100 MHz, an impedance in the gap 104 between the upper electrode 2 and lower electrode 3 is so low that it becomes hard to obtain a voltage necessary to produce plasma. Therefore, the frequency exceeding 100 MHz is not preferred.

Figure 8A:
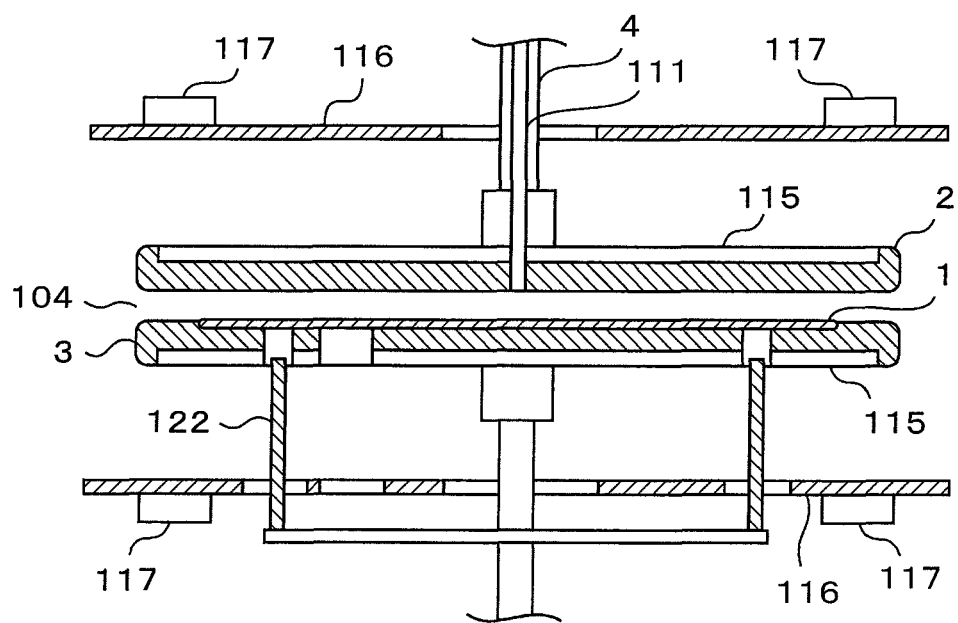
FIG. 8A is a diagram showing a state of a discharge induction part during heat treatment by the discharge induction part in the fourth embodiment of the present invention.
Figure 8B:
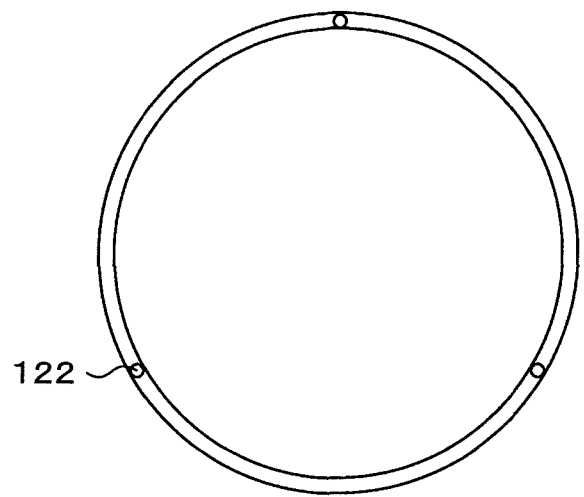
FIG. 8B is a diagram showing a sample-to-be-heated raising and lowering mechanism of the discharge induction part in the fourth embodiment of the present invention.
Figure 9:
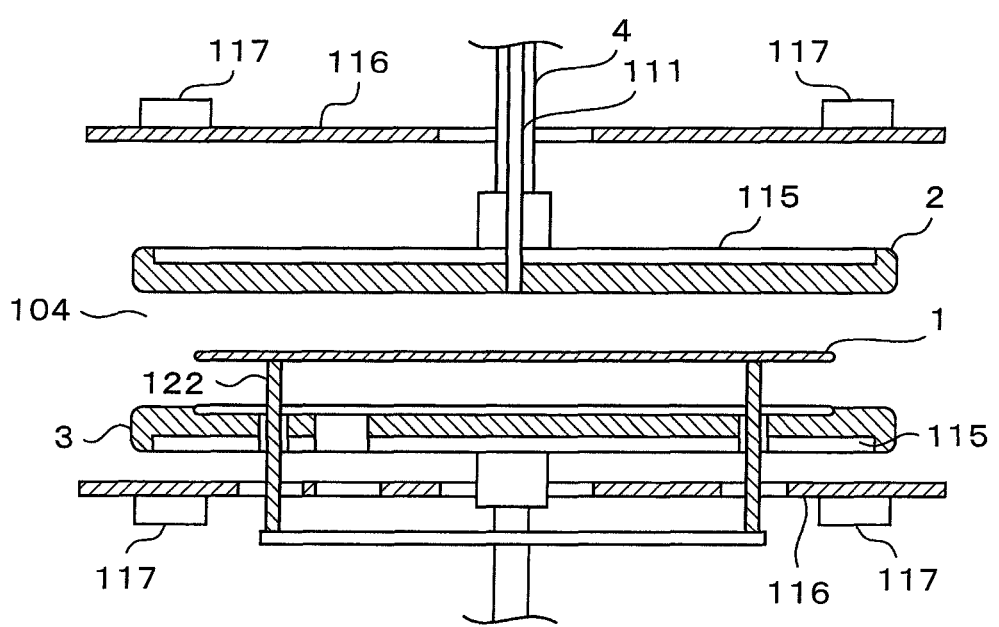
FIG. 9 is a detailed diagram showing the discharge induction part included in the fourth embodiment of the present invention, or more particularly, showing a state of the discharge induction part attained at the time of carrying a sample to be heated.

FIG. 8A, FIG. 8B, and FIG. 9 show the details of a heating region (in which the sample to be heated 1, upper electrode 2, lower electrode 3, and plate or coating 115 exhibiting a high melting point and a low radiation actor, shields 116, and heaters 117 are present) in the heat treatment apparatus in accordance with the present embodiment. FIG. 8A shows a state in which the heating region is being heated or cooled after being heated, and FIG. 9 shows a state in which the sample to be heated 1 is brought. FIG. 8B is a plan view of the sample-to-be heated raising and lowering mechanism 122. For bringing the sample to be heated 1 that is placed on the lower electrode 3, first, the lower electrode 3 is lowered from a treatment state shown in FIG. 8A to the state shown in FIG. 9 by means of the raising and lowering mechanism 120. When the lower electrode 3 is lowered, the sample-to-be-heated raising and lowering mechanism 122 creates a space between the sample to be heated 1 and lower electrode 3. After a carrier arm is inserted into the space, the sample-to-be-heated raising and lowering mechanism 122 is lowered. Thus, the sample to be heated 1 is handed over to the carrier arm and then taken out.

For placing the sample to be heated 1 on the lower electrode 3, the reverse of the foregoing procedure is followed. Specifically, the lower-electrode raising and lowering mechanism 120 and sample-to-be-heated raising and lowering mechanism 122 are lowered, and the carrier arm on which the sample to be heated 1 is mounted is inserted above the lower electrode 3. Thereafter, the sample-to-be-heated raising and lowering mechanism 122 is raised in order to receive the sample to be heated 1 from the carrier arm. Further, the lower-electrode raising and lowering mechanism 120 is raised in order to raise the lower electrode 3 to a heating processing position. Thus, the sample to be heated 1 can be placed on the lower electrode 3. Since the sample-to-be-heated raising and lowering mechanism 122 is exposed to relatively high temperature, the sample-to-be-heated raising and lowering mechanism 122 is preferably made of a material that withstands the high temperature but does not produce a contaminant. In the present embodiment, the sample-to-be-heated raising and lowering mechanism 122 is made of silicon carbide (SiC) that is a sintered compact.

The present embodiment has been described on the assumption that the one sample to be heated 1 is placed on the lower electrode 3. Alternatively, the upper electrode 2 and lower electrode 3 may be realized with large-size electrodes, and plural samples to be heated 1 may be placed on the lower electrode 3 and treated simultaneously. Otherwise, plural pairs of the upper electrode and lower electrode may be included in order to simultaneously treat the plural samples to be heated.

Advantages of the present invention provided by the foregoing embodiments will be summarized below. In the present art, gas heating dependent on an atmospheric-pressure glow discharge induced in a narrow gap is used as a heat source to heat the sample to be heated 1. Under this principle, four advantages described below and unavailable in related arts are provided.

The first advantage lies in thermal efficiency. A gas in the gap exhibits very small heat capacity. An adiabatic member is disposed to surround the upper electrode 2 and lower electrode 3 including the sample to be heated 1, or the plate or coating 115 exhibiting a high melting point and a low radiation factor is placed on each of the sides of the upper electrode 2 and lower electrode 3 which do not come into contact with plasma. Accordingly, the sample to be heated 1 can be heated in a system in which a heating loss from radiation is quite limited.

The second advantage lies in heating responsiveness and uniformity. Since the heat capacity of a heating part is very small, a fast temperature rise and fall can be achieved. In addition, since gas heating dependent on a glow discharge is used as a heat source, heating can be achieved uniformly on a planar basis due to a spread of the glow discharge. Since uniformity in temperature is high, a variance in a device property occurring on the surface of the sample to be heated 1 due to heat treatment can be suppressed. Besides, damage to be caused by a thermal stress from a temperature difference on the surface of the sample to be heated 1 at the time of an rapid temperature rise or the like can be suppressed.

The third advantage is a decrease in the number of parts consumed due to heating processing. In the present art, a gas that comes into contact with the sample to be heated 1 is directly heated. Therefore, a region in which the temperature becomes high is confined to members located quite near the sample to be heated 1. In addition, the temperature is equal to or lower than the temperature of the sample to be heated 1. Therefore, the service lives of the members are long, and a region in which parts have to be replaced with new ones because of deterioration is limited.

The fourth advantage is suppressed roughing of the surface of the sample to be heated 1. In the present art, since a temperature rise/fall time can be shortened owing to the foregoing advantages, a time during which the sample to be heated 1 is exposed to a high-temperature atmosphere is shortened to be a minimum necessary. Accordingly, surface roughing can be suppressed. In addition, in the present art, plasma from an atmospheric-pressure glow discharge is exposed to a sample to be heated in order to heat the sample to be heated. On a stage of heating, rare-gas plasma is employed. If a reactive gas is added to a rare gas in the process of a temperature rise or fall, formation and removal of a protective film can be consistently achieved during a heating process. Therefore, processes of forming and removing the protective film which are performed by an apparatus other than the heat treatment apparatus become unnecessary. This leads to a reduction in a cost of fabrication.

The present invention is not limited to the aforesaid embodiments but includes various variants. For example, the embodiments have been described for a better understanding of the present invention, and are therefore not limited to those including all the aforesaid components. In addition, part of the components of a certain embodiment may be replaced with a counterpart of any other embodiment. A component of a certain embodiment may be added to the components of any other embodiment. Part of the components of each of the embodiments may be added to any other embodiment, excluded, or replaced with a counterpart of any other embodiment.

What is claimed is:

1. A heat treatment apparatus, comprising:
a heat treatment chamber for performing a heat treatment of a sample to be heated;
a first plate-shaped electrode disposed in the heat treatment chamber;
a second late-shaped electrode facing to the first electrode, disposed in the heat treatment chamber and on which the sample to be heated is placed;
a high-frequency power supply for feeding a high-frequency power to the first electrode through a first power feed line to generate plasma between the first electrode and the second electrode;
an adiabatic member for enclosing the first electrode and the second electrode to suppress radiation heat radiated from the first electrode and the second electrode;
wherein the second electrode is grounded through a second power feed line,
a substrate of the first electrode and a substrate of the second electrode are made of graphite each,
the first power feed line and the second power feed line are made of graphite each,
a distance from the first electrode to the adiabatic member is longer than a distance between the first electrode and the second electrode, and
a distance from the second electrode to the adiabatic member is longer than the distance between the first electrode and the second electrode.

2. The heat treatment apparatus according to claim 1, wherein the first electrode is coated with a material of a high melting point and a low radiation factor on an opposite side of the surface facing to the second electrode, and
the second electrode coated with material of a high melting point and a low radiation factor on an opposite side of the surface facing to the first electrode.

3. The heat treatment apparatus according to claim 1, wherein the first electrode has a plate of a high melting point and a low radiation factor on an opposite side of the surface facing to the second electrode, and
the second electrode has a late of a material of a high melting point and a low radiation factor on an opposite side of the surface facing to the first electrode.

4. The heat treatment apparatus according to claim 1, wherein a part of the first power feed line and a part of the second power feed line are disposed in the heat treatment chamber.

5. The heat treatment apparatus according to claim 2, wherein the material of a high melting point and a low radiation factor coated on the first electrode is TaC.

6. The heat treatment apparatus according to claim 1, further comprising a control unit configured to control the high-frequency power supply to obtain the desired temperature of the sample to be heated based on a measured temperature of the sample to be heated.

7. The heat treatment apparatus according to claim 1, wherein a distance between the first electrode and the second electrode is shorter than a distance which enables plasma generation when pressure for generating plasma is near atmospheric pressure.

* * * * *